United States Patent [19]
Mizutani

[11] Patent Number: 5,692,002
[45] Date of Patent: Nov. 25, 1997

[54] BURIED HETEROSTRUCTURE SEMICONDUCTOR LASER FABRICATED ON A P-TYPE SUBSTRATE

[75] Inventor: Tomoko Mizutani, Tokyo, Japan

[73] Assignee: NEC Corporation, Tokyo, Japan

[21] Appl. No.: 531,314

[22] Filed: Sep. 20, 1995

[30] Foreign Application Priority Data

Sep. 20, 1994 [JP] Japan ................................ 6-225131

[51] Int. Cl.⁶ ............................................. H01S 3/19
[52] U.S. Cl. ................................... 372/46; 372/45
[58] Field of Search ................................ 372/46, 45

[56] References Cited

U.S. PATENT DOCUMENTS

| | | | |
|---|---|---|---|
| 4,870,650 | 9/1989 | Mink | 372/46 |
| 5,228,048 | 7/1993 | Takemoto et al. | 372/46 |
| 5,361,271 | 11/1994 | Takiguchi et al. | 372/45 |

FOREIGN PATENT DOCUMENTS

| | | | |
|---|---|---|---|
| 60-21587 | 2/1985 | Japan | 372/46 |
| 4-84484 | 3/1992 | Japan | 372/46 |

OTHER PUBLICATIONS by Ikuo Mito et al., "InGaAsP Double–Channel–Planar–Buried–Heterostructure Laser Diode (DC–PBH LD) With Effective Current Confinement", Journal of Lightwave Technology, vol. LT–1, No. 1, Mar. 1983.

Primary Examiner—Rodney B. Bovernick
Assistant Examiner—Yisun Song
Attorney, Agent, or Firm—Young & Thompson

[57] ABSTRACT

A buried heterostructure semiconductor laser formed on a substrate having a first semiconductor of p-type conductivity has a mesa-striped active layer region having a height extending from a first p-type semiconductor layer at the foot of the mesa to a n-type cladding layer on the top of the mesa. On both sides of the mesa-striped region, a second p-type semiconductor layer, a first n-type semiconductor layer, a third p-type semiconductor layer, and a second semiconductor layer having a band gap smaller than that of the other layers except the active layer are sequentially formed from the substrate side. Additionally, the entire structure is further buried with a n-type semiconductor layer. The second semiconductor layer may be inserted in between the second p-type semiconductor layer and the first n-type semiconductor layer as well. Furthermore, the second semiconductor layer may be of a semiconductor material with lower carrier concentration doping than the other layers except the active layer, which is usually undoped. In an alternative configuration, the two sides of the mesa structure may form a channel into which the aforementioned layers will be buried.

15 Claims, 7 Drawing Sheets

BURIED HETEROSTRUCTURE SEMICONDUCTOR LASER FABRICATED ON A P-TYPE SUBSTRATE

BACKGROUND OF THE INVENTION

1. Field of the Invention

The present invention relates to the structure of a semiconductor laser, and more specifically, to the structure of a semiconductor laser array suitable for optical interconnection of computers, switchboards and the like, and to the structure of a semiconductor laser for optical communications.

2. Description of the Related Art

A Double-Channel-Planar-Buried-Heterostructure (DC-PBH) laser has a buried sectional structure as shown in FIG. 13, and is a device with an excellent high-output power property at high operating temperatures. An example of a conventional DC-PBH laser can be found in, Mito et al., "InGaAsP Double-Channel-Planar-Buried Heterostructure Laser Diode (DC-PBH LD) with Effective Current Confinement", Journal of Lightwave Technol., Vol. LT-1, No. 1, pp. 185–202 (1983)). In FIG. 13, the DC-PBH laser comprises an n-InP(001) substrate 12, an n-InP buffer layer 13, an n-InP cladding layer 14, an InGaAsP layer 15, a p-InP cladding layer 16, an InGaAsP active layer 17, a p-InP current blocking layer 18, an n-InP current blocking layer 19, and a p-InP burying layer 20.

However, since this conventional DC-PBH laser uses an n-type substrate, the n-type side becomes the common electrode when laser elements are formed in an array structure. In recent years, however, since ECL driving by npn bipolar transistors is been frequently used, a laser with a buried heterostructure fabricated on a p-type substrate has been desired. In a DC-PBH laser having a structure in which n-type semiconductors have merely been replaced by p-type semiconductors, and vice versa, the burying layer along the sides of the active layer becomes an n-type layer. In this case, since electrons are more mobile than holes, the leakage current flowing through the sides of the active layer increases, so that operation characteristics comparative to those of conventional n-type substrate DC-PBH lasers cannot be obtained.

SUMMARY OF THE INVENTION

It is an object of the present invention to eliminate the drawback in forming a buried semiconductor laser of a conventional structure on a p-type substrate so as to provide a buried heterostructure of semiconductor lasers having preferable high-temperature operation properties even when made on a p-type substrate.

A first aspect of the present invention is found in a buried heterostructure (BH) semiconductor laser characterized as follows. The BH laser structure is formed on a substrate comprising a semiconductor material having p-type conductivity. An active layer is laminarly sandwiched between an n-type cladding layer and a p-type cladding layer both of semiconductor materials having band gaps larger than that of the active layer. Channels having a depth reaching into a first p-type semiconductor layer laminated on the substrate and composed of a first semiconductor material of p-type conductivity is formed along both sides of an active layer region which now has a mesa-stripe structure. Each channel is buried sequentially form the substrate side with a second p-type semiconductor layer, a first n-type semiconductor layer, and a third p-type semiconductor layer, all of which having a band gap larger than that of the active layer; and lastly with a second semiconductor layer having a band gap smaller than the band gap of any of the second p-type semiconductor layer, the first n-type semiconductor layer, and the third p-type semiconductor layer. The entire structure is further buried by a second n-type semiconductor layer having a band gap larger than that of the active layer. The second n-type semiconductor layer may be composed of the first semiconductor material. The n-type and the p-type cladding layers may be composed of a same semiconductor material which can also be the first semiconductor material. Likewise the second p-type semiconductor layer, the first n-type semiconductor layer, and the third p-type semiconductor layer can all be of the same first semiconductor material. The semiconductor material constituting the substrate may also be of the first semiconductor material.

The second aspect of the present invention has the same features as the first aspect of this invention described above except that each channel is buried sequentially from the substrate side with the second p-type semiconductor layer, the second semiconductor layer, the first n-type semiconductor layer, the third p-type semiconductor layer, and a third semiconductor layer having a band gap smaller than that of any of the second p-type semiconductor layer, the first n-type semiconductor layer, and the third p-type semiconductor layer.

The fourth aspect of the present invention has the same features at the first aspect of this invention described above except that each channel is buried sequentially from the substrate side with the second p-type semiconductor layer, a fourth p-type semiconductor layer, the first n-type semiconductor layer, and the third p-type semiconductor layer, all of which having a band gap larger than that of the active layer, wherein the fourth p-type semiconductor layer has a carrier concentration lower than any of the second p-type semiconductor layer, the first n-type semiconductor layer, and the third p-type semiconductor layer.

The above mentioned aspects of the present invention are not restricted to DC-PBH structures having double-channeled geometry. That is, in an alternative aspect, it is only required that the same laminated semiconductor layer structure burying the interior of the channels to be formed in contact with both sides of the mesa-stripe structure into which the active layer is formed. Thus the present invention may be implemented in most BH structures having mesa-striped active layer regions.

In order to achieve low threshold current and high slope efficiency in a semiconductor laser formed on a p-type substrate, it is important to decrease unnecessary leakage current flowing through areas other than the active layer. In a BH-type laser, the current flowing through the regions adjacent to the active layer region can be constrained by the npnp structure of the current blocking layers to a certain extent. However, if both sides of the active layer are buried with an n-type current blocking layer, since the mobility of electrons is considerably larger than the mobility of holes, electrons easily flow from the n-type cladding layer on the upper portion of the active layer into the n-type current blocking layer, and are further easily injected into the pn junction of the channel portion, thus significantly deteriorating the properties of the laser.

In a conventional DC-PBH laser structure in which the conductivity type of the semiconductor is reversed (the structure in which the p-type and the n-type are reversed), both sides of the active layer are buried with n-type semiconductor layers. Thus, the flow of electrons from the upper portion of the active layer into the n-type current blocking layer has been unavoidable. The present inventor thus contemplated that, if both sides of the active layer were to be buried with a p-type semiconductor, the flow of electrons could be constrained to a certain extent.

Turning now to the current blocking action of the current blocking layers, the current flowing through the sides of the active layer is blocked by the pnpn thyristor structure formed of the current blocking layers. The presence of electrons passing from the n-type cladding layer on the upper portion of the active layer through the p-type layers on the sides of the active layer and into the n-type blocking layer and further into the p-type substrate has been inevitable. Likewise, the presence of holes flowing into the p-type current blocking layer from the p-type substrate, and further flowing into the upper n-type current blocking layer has been unavoidable.

FIG. 12 schematically shows a pnpn thyristor structure. When a positive bias is applied as shown in the figure, the turn-on of the thyristor is enhanced by a decrease in the diffusion potential at the p/n junction J1 caused by electrons flowing into the p1 layer from the n1 layer, and a decrease in the diffusion potential at the n/p junction J3 caused by holes flowing into the n2 layer from the p2 layer.

The present invention incorporates into the pnpn structure of the current blocking layer, a semiconductor layer having a band gap smaller than the band gaps of p1, n1, p2 and n2 layers at locations corresponding to the junction J1 and the junction J3, in an effort to absorb electrons flowing into p-type layers from n-type current blocking layers and holes flowing into n-type layers from p-type current blocking layers, and to prevent decrease in diffusion potential at each junctions. Furthermore, the same effect is expected by the insertion of a semiconductor layer having a low carrier density at locations corresponding to junctions J1 and J3, even if the semiconductor layer has the same band gap. As a result, the current blocking layers become difficult to turn on, and a buried heterostructure semiconductor laser having a preferable high temperature, high output properties can be obtained on a p-type substrate.

BRIEF DESCRIPTION OF THE DRAWINGS

This above-mentioned and other objects, features and advantages of this invention will become more apparent by reference to the following detailed description of the invention taken in conjunction with the accompanying drawings, wherein:

FIG. 2(a) is a diagram showing a wafer before burying; and FIG. 2(b) is a diagram showing the buried from;

FIG. 3(a) is a diagram showing a wafer before burying.

FIG. 8(a) is a diagram showing a wafer before burying.

FIG. 9 is a schematic diagram for illustrating another method for manufacturing the semiconductor laser of FIG. 7.

DESCRIPTION OF THE PREFERRED EMBODIMENTS

Embodiment 1

Figure 1:
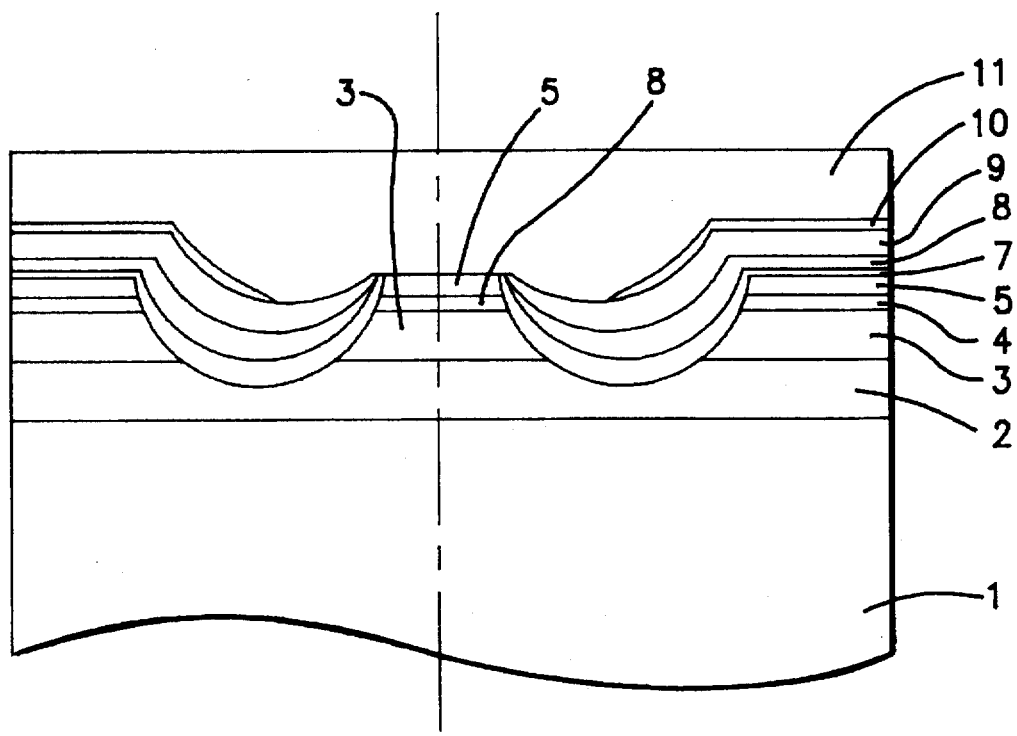
FIG. 1 is a diagram showing an InGaAsP/InP-based buried heterostructure semiconductor laser according to the first aspect of the present invention.

FIG. 1 is a diagram showing the structure of a semiconductor laser formed on a p-type InP substrate according to an embodiment of the present invention. InP is used as the first p-type semiconductor layer, the second p-type semiconductor layer, the first n-type semiconductor layer, the third p-type semiconductor layer, and the second n-type semiconductor layer, and InGaAsP is used as the second semiconductor layer as well as the active layer.

This semiconductor laser is formed on a p-InP(001) substrate 1, and has channels having a depth which reaches the p-InP buffer layer 2 (the first p-type semiconductor layer) at both sides of the mesa-striped region of the InGaAsP active layer 6, and has the structure in which the interior of the channels is sequentially buried with a p-InP current blocking layer 7 (the second p-type semiconductor layer), an n-InP current blocking layer 8 (the first n-type semiconductor layer), a p-InP current blocking layer 9 (the third p-type semiconductor layer), and an i-InGaAsP layer 10 (the second semiconductor layer), and further the entire structure is buried with an n-InP burying layer 11 (the second n-type semiconductor layer). As shown in FIG. 1, it is preferable that the p-InP current blocking layer 9 and the n-InP burying layer 11 are in contact with each other at portions adjacent to the mesa structure. In other words, it is preferable that the i-InGaAsP layer 10 is not formed in regions close to the mesa so as to avoid creating a current leakage path from the p-InP current blocking layer 7 through this i-InGaAsP layer 10 to the n-InP burying layer 11. Such a leakage current would compete with the proper current through the InGaAsP active layer 6.

Figure 2A:
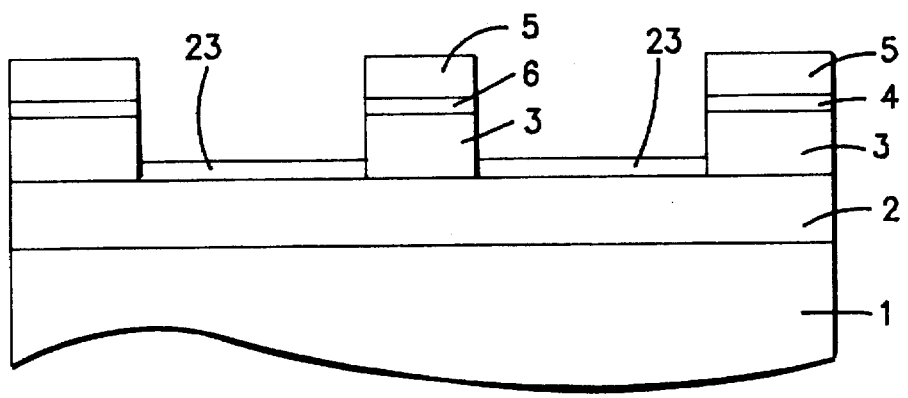
FIG. 2(a) and FIG. 2(b) are a schematic diagram for illustrating a method for manufacturing the semiconductor laser of FIG. 1.
Figure 2B:
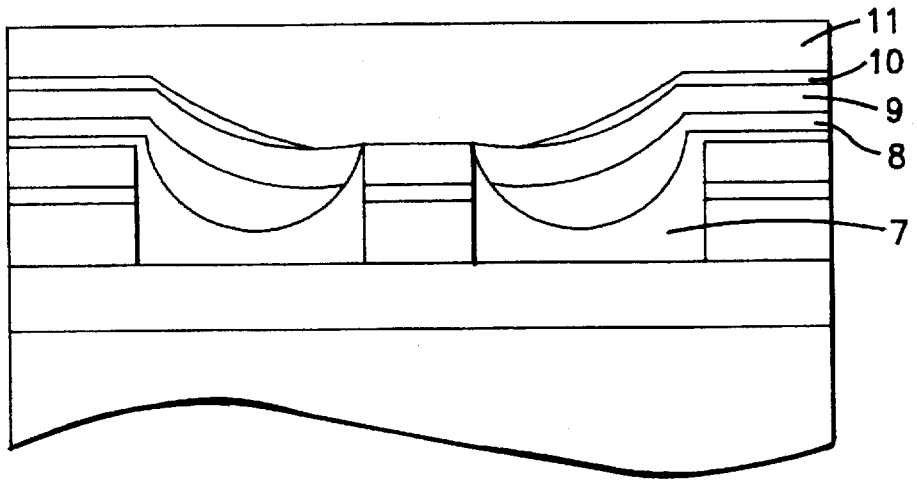

Next, the method for the manufacture of this embodiment is described referring to FIG. 2(a) and FIG. 2(b), which are schematic diagrams illustrating the manufacturing process steps of this embodiment. As FIG. 2(a) shows, a p-InP buffer layer 2 Zn doped to a carrier concentration of ~5×10$^{17}$ cm$^{-3}$ (hereinafter referred to as "~5×10$^{17}$ cm$^{-3}$ Zn doped", etc) of a thickness of 0.5 μm is grown on a p-InP(001) substrate 1 by the well known Metal-Organic-Vapor-Phase-Epitaxy (MOVPE) method. Next, a pair of silicon oxide film strips 23 is formed in parallel on the p-InP buffer layer 2 using conventional photolithography. These strips of silicon oxide film define the channel region that is to surround the active layer region which is to be formed in between the strips. A p-InP cladding layer 3 ($\sim 5 \times 10^{17}$ cm$^{-3}$ Zn doped) is selectively grown on exposed portions of the p-InP buffer layer by MOVPE, using the silicon oxide film 23 as a growth mask. Further, as InGaAsP active layer 6 of a band gap wavelength of 1.3 μm is grown, and an n-InP cladding layer 5 ($\sim 1.2 \times 10^{18}$ cm$^{-3}$ Si doped) of a thickness of 0.6 μm is grown, to form a double heterostructure (DH) wafer.

Although the MOVPE method is used in this embodiment, the use of the MBE method is also possible. Moreover, if the active layer is made up of a multiple quantum well (MQW) active layer comprising a Separate confinement Heterostructure (SCH)-type MQW structure consisting of a layer of 1.13 μm band gap wavelength InGaAsP separate confinement layer of a thickness of 60 nm; 6.5 cycles of a 1.40 μm band gap wavelength InGaAsP well (undoped) of a thickness of 5.7 nm, and a 1.13 μm band gap wavelength InGaAsP barrier (undoped) of a thickness of 10 nm; and of a 1.13 μm band gap wavelength InGaAsP separate confinement layer of a thickness of 60 nm, further improvement in lasing properties are expected. (Hereinafter, semiconductor material such as InGaAsP having band gap wavelength of x μm will be referred to as x μm InGaAsP, etc.)

Next, as shown in FIG. 2(b), after removing the silicon oxide film 23, the channels are buried by sequentially growing a p-InP current blocking layer 7 ($\sim 1 \times 10^{18}$ cm$^{-3}$ Zn doped), an n-InP current blocking layer 8 ($\sim 1 \times 10^{18}$ cm$^{-3}$ Si doped), a p-InP current blocking layer 9 ($\sim 1 \times 10^{18}$ cm$^{-3}$ Zn doped), and an i-InGaAsP layer 10. As shown in FIG. 2(b), the thickness of the i-InGaAsP layer 10 inside the channels decreases as they approach the mesa region. Although the MOVPE method is used to bury the channels in this embodiment, the use of the Liquid Phase Epitaxy (LPE) method or the MBE method is also possible. By further growing an n-InP burying layer 11 ($\sim 1.2 \times 10^{18}$ cm$^{-3}$ Si doped) to cover the entire surface, the buried heterostructure semiconductor laser on a p-type substrate as shown in FIG. 1 is obtained.

Figure 3A:
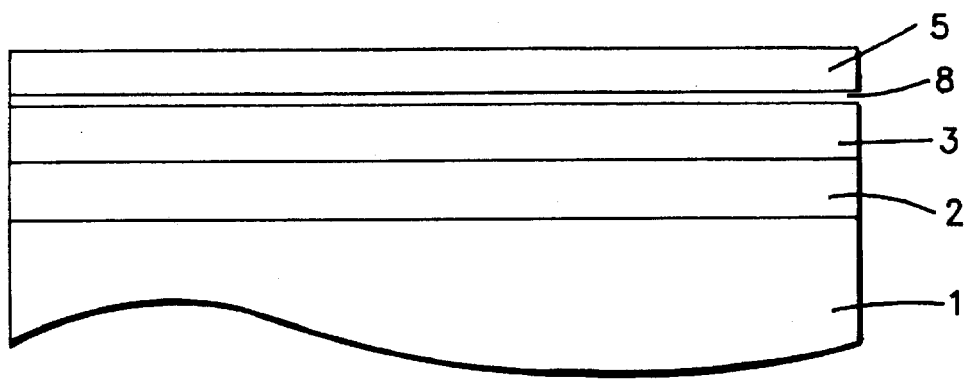
FIG. 3(a) and (b) is a schematic diagram for illustrating another method for manufacturing the semiconductor laser of FIG. 1.
Figure 3B:
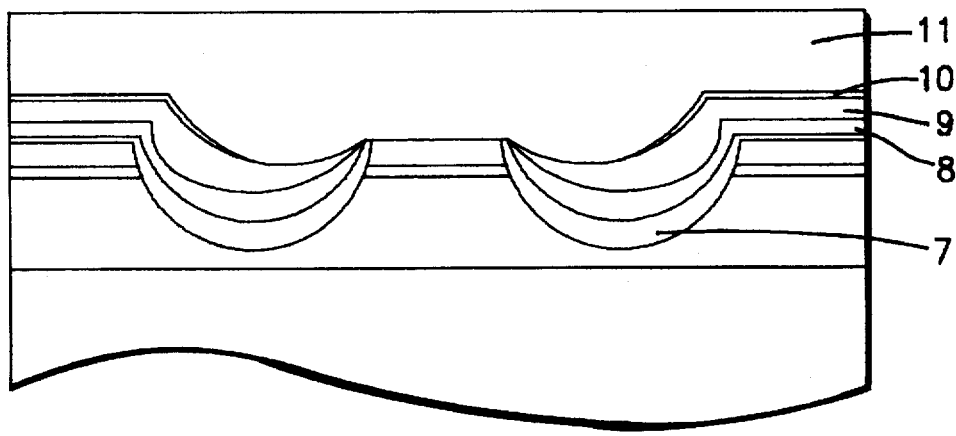
FIG. 3(b) is a diagram showing the buried form.

Next, another method for the manufacture of this embodiment is described referring to FIG. 3(a) and FIG. 3(b), which are schematic diagrams illustrating another manufacturing process steps of this embodiment. As FIG. 3(a) shows, after a p-InP buffer layer 2 ($\sim 5 \times 10^{17}$ cm$^{-3}$ Zn doped) of a thickness of 0.5 μm is grown on a p-InP(001) substrate 1, a p-InP cladding layer 3 ($\sim 5 \times 10^{17}$ cm$^{-3}$ Zn doped) is grown by the MOVPE method. Further in this embodiment, an InGaAsP active layer 6 of a band gap wavelength of 1.3 μm is grown, and an n-InP cladding layer 5 ($\sim 1.2 \times 10^{18}$ cm$^{-3}$ Si doped) of a thickness of 0.6 μm is grown, to form a DH wafer. Although the MOVPE method is used in this embodiment, the use of the MBE method is also possible. If the active layer is of an MQW structure, further better properties are expected.

Next, as FIG. 3(b) shows, a double channel is formed on the MQW wafer by a Br-methanol based etchant using a striped mask for mesa information. The striped mask may be of silicon oxide or silicon nitride and may be obtained by conventional film growth methods and photolithography techniques. Although wet etching is used in this embodiment, the use of dry etching is also possible. The double channel is buried by sequentially growing a p-InP current blocking layer 7 ($\sim 1 \times 10^{18}$ cm$^{-3}$ Zn doped), an n-InP current blocking layer 8 ($\sim 1 \times 10^{18}$ cm$^{-3}$ Si doped), a p-InP current blocking layer 9 ($\sim 1 \times 10^{18}$ cm$^{-3}$ Zn doped), and an i-InGaAsP layer 10. As shown in FIG. 3(b), the thickness of the i-InGaAsP layer 10 inside the channels decreases as they approach the mesa region.

By further growing an n-InP burying layer 11 ($\sim 1.2 \times 10^{18}$ cm$^{-3}$ Si doped) to cover the entire surface, the buried heterostructure semiconductor laser on a p-type substrate as shown in FIG. 1 is obtained. Although in this embodiment, the MOVPE method is used to grow the layers in the channels, the use of the LPE method or the MBE method is also possible.

Embodiment 2

Figure 4:
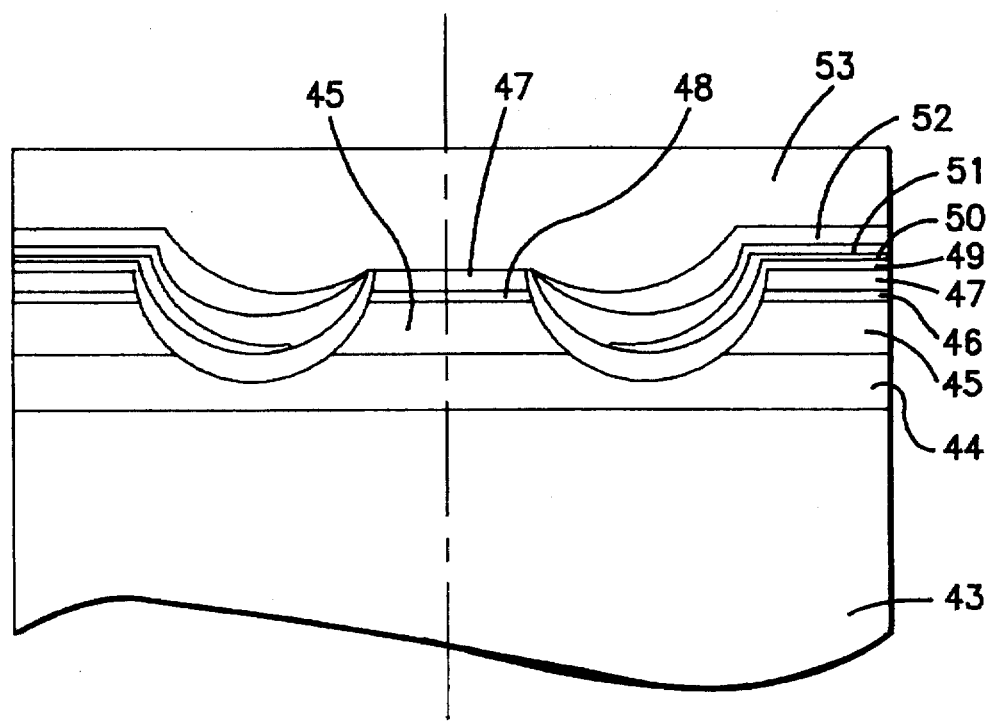
FIG. 4 is a diagram showing an InGaAsP/InP-based buried heterostructure semiconductor laser according to the second aspect of the present invention.

FIG. 4 is a diagram showing the structure of a semiconductor laser formed on a p-type InP substrate according to the second aspect of the present invention. InP is used as the first p-type semiconductor layer, the second p-type semiconductor layer, the first n-type semiconductor layer, the third p-type semiconductor layer, and the second n-type semiconductor layer, and InGaAsP is used as the second semiconductor layer as well as the active layer.

This semiconductor laser is formed on a p-InP(001) substrate 43, and has channels having a depth which reaches the p-InP buffer layer 44 at least at both sides of the stripe region of the InGaAsP active layer 48, and has a structure in which the interior of the channels are sequentially buried with a p-InP current blocking layer 49, an i-InGaAsP layer 50, an n-InP current blocking layer 51, and a p-InP current blocking layer 52, and further the entire structure is covered and buried with an n-InP burying layer 53. As shown in FIG. 4, due to the same leakage path considerations stated earlier for the first embodiment of this invention, it is preferable that the p-InP current blocking layer 49 and the n-InP current blocking layer 51 are in contact with each other at portions adjacent to the mesa structure.

In FIG. 4, 45 indicates the p-InP cladding layer, 46 indicates the InGaAsP layer, 47 indicates the n-InP cladding layer, and 48 indicates the InGaAsP active layer.

The method for manufacturing this semiconductor laser is the same as the methods of Embodiment 1.

Embodiment 3

Figure 5:
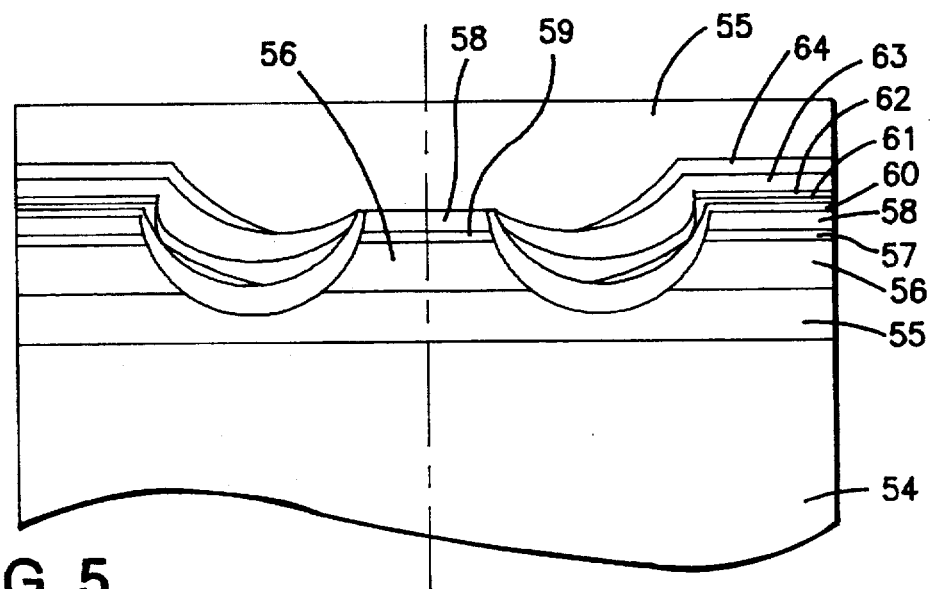
FIG. 5 is a diagram showing an InGaAsP/InP-based buried heterostructure semiconductor laser according to the third aspect of the present invention.

FIG. 5 is a diagram showing the structure of a semiconductor laser formed on a p-type InP substrate according to the third aspect of the present invention. InP is used as the first p-type semiconductor layer, the second p-type semiconductor layer, the first n-type semiconductor layer, the third p-type semiconductor layer, and the second n-type semiconductor layer, and InGaAsP is used as the second and third semiconductor layer as well as the active layer.

This semiconductor laser is formed on a p-InP(001) substrate 54, and has channels having a depth which reaches the p-InP buffer layer 55 at least at both sides of the stripe region of the InGaAsP active layer 59, and has the structure in which the interior of the channels is sequentially buried with a p-InP current blocking layer 60, an i-InGaAsP layer 61, an n-InP current blocking layer 62, a p-InP current blocking layer 63, and an i-InGaAsP layer 64, and further the entire structure is buried with an n-InP burying layer 65. As shown in FIG. 5, due to the same leakage path considerations stated earlier for the first embodiment of this invention, it is preferable that the p-InP current blocking layer 60 and the n-InP current blocking layer 62, as well as the p-InP current blocking layer 63 and the n-InP burying layer 65 are in contact with each other at portions adjacent to the mesa structure.

In FIG. 5, 56 indicates the p-InP cladding layer, 57 indicates the InGaAsP layer, 58 indicates the n-InP cladding layer, and 59 indicates the InGaAsP active layer.

The method for manufacturing this semiconductor laser is the same as the methods of Embodiment 1.

Embodiment 4

Figure 6:
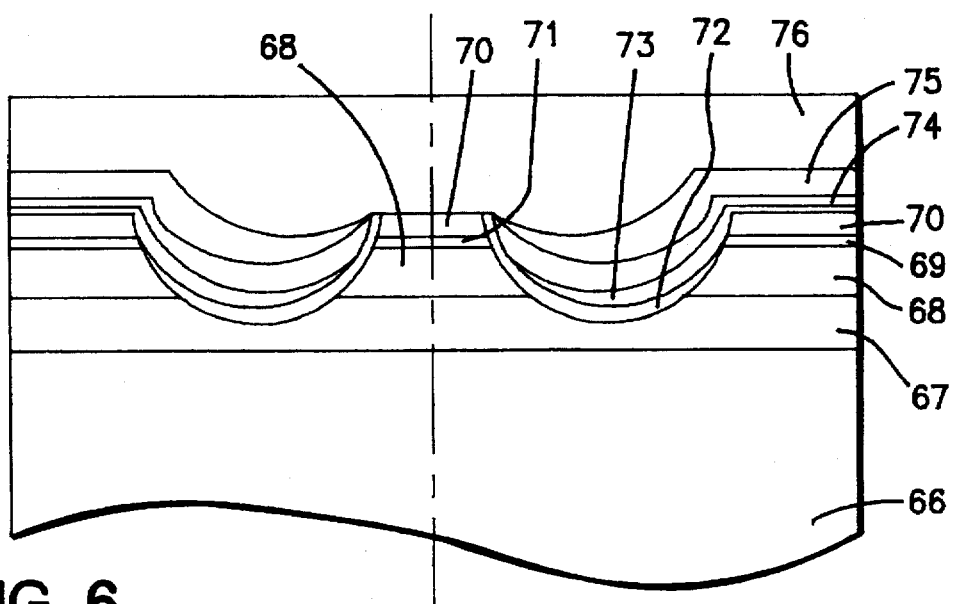
FIG. 6 is a diagram showing an InGaAsP/InP-based buried heterostructure semiconductor laser according to the fourth aspect of the present invention.

FIG. 6 is a diagram showing the structure of a semiconductor laser formed on a p-type InP substrate according to the fourth aspect of the present invention. InP is used as the first p-type semiconductor layer, the second p-type semiconductor layer, the first n-type semiconductor layer, the third p-type semiconductor layer, and the second n-type semiconductor layer, and InGaAsP is sued as the active layer. Additionally, p-type InP is used as the fourth p-type semiconductor layer of a low carrier density.

This semiconductor laser is formed on a p-InP(001) substrate 66, and has channels having a depth which reaches the p-InP buffer layer 67 at least at both sides of the stripe region of the InGaAsP active layer 71, and has the structure in which the interior of the channels are sequentially buried with a p-InP current blocking layer 72, a low carrier density p-InP current blocking layer 73, an n-InP current blocking layer 74, and a p-InP current blocking layer 75, and further the entire structure is buried with an n-InP burying layer 76.

In FIG. 6, 68 indicates the p-InP cladding layer, 69 indicates the InGaAsP layer, 70 indicates the n-InP cladding layer, and 71 indicates the InGaAsP active layer.

The method for manufacturing this semiconductor laser is the same as the methods of Embodiment 1.

Embodiment 5

Figure 7:
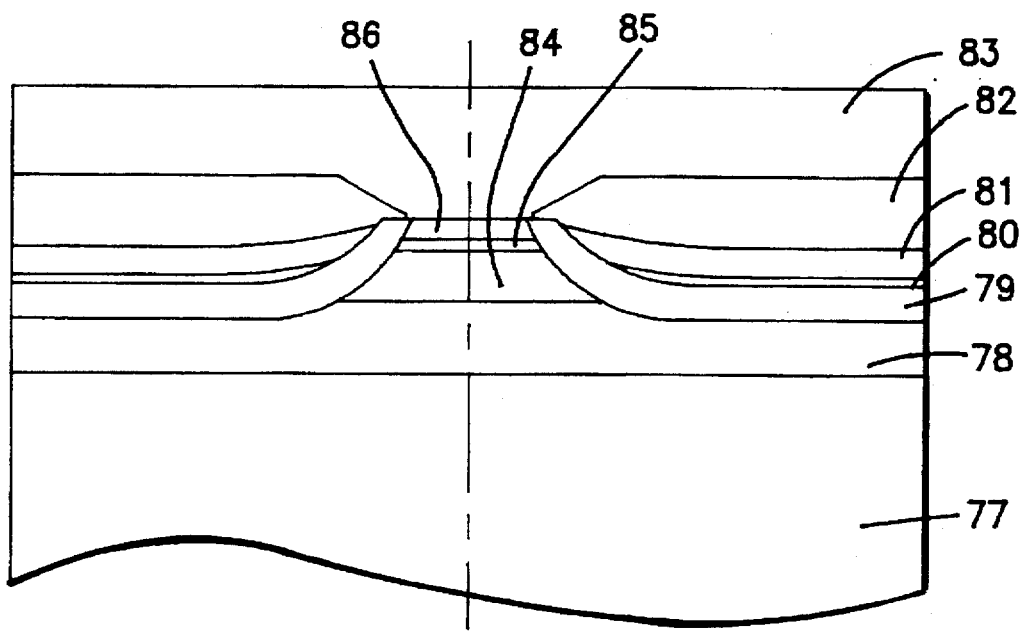
FIG. 7 is a diagram showing an InGaAsP/InP-based buried heterostructure semiconductor laser according to an alternative form of the second aspect of the present invention.

FIG. 7 is a diagram showing the structure of a semiconductor laser formed on a p-type InP substrate according to the second aspect of the present invention, but with an alternative mesa periphery configuration. Namely, instead of a pair of channels filled with the burying layers, the mesa-striped active region is simply surrounded by the burying layers. InP is used as the first p-type semiconductor layer, the second p-type semiconductor layer, the first n-type semiconductor layer, the third p-type semiconductor layer, and the second n-type semiconductor layer, and InGaAsP is used as the second semiconductor layer as well as the active layer.

This semiconductor laser is formed on a p-InP(001) substrate 77, and has a mesa-striped active layer region having a height which extends from the p-InP buffer layer 78 at the foot of the mesa to the n-InP cladding layer 86 at the top of the mesa. Both sides of the mesa-striped InGaAsP active layer region are sequentially buried with a p-InP current blocking layer 79, an i-InGaAsP layer 80, an n-InP current blocking layer 81, and a p-InP current blocking layer 82. Further the entire structure is buried with an n-InP burying layer 83. As shown in FIG. 7, due to the same leakage path considerations stated earlier for the first embodiment of this invention, it is preferable that the p-InP current blocking layer 79 and the n-InP current blocking layer 81 are in contact with each other at portions adjacent to the mesa structure.

In FIG. 7, 83 indicates the n-InP burying layer, 84 indicates the p-InP cladding layer, 85 indicates the InGaAsP active layer, and 86 indicates the n-InP cladding layer.

Figure 8A:
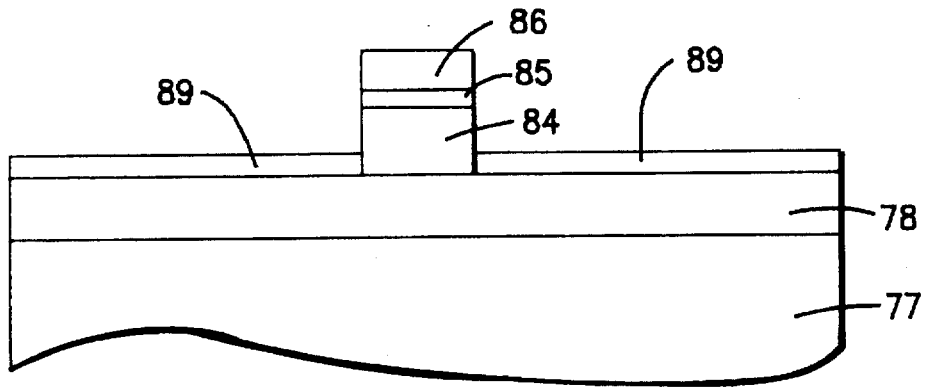
FIG. 8(a) and (b) is a schematic diagram for illustrating a method for manufacturing the semiconductor laser of FIG. 7.
Figure 8B:
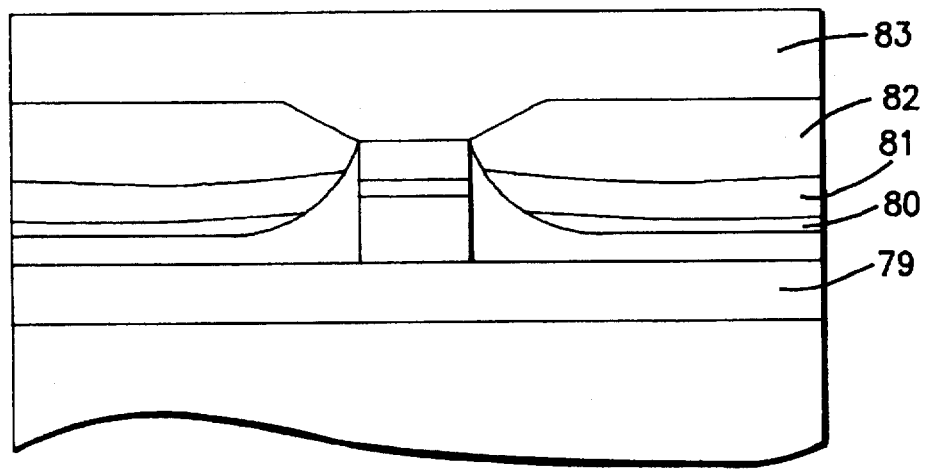
FIG. 8(b) is a diagram showing the buried form.
Figure 13:
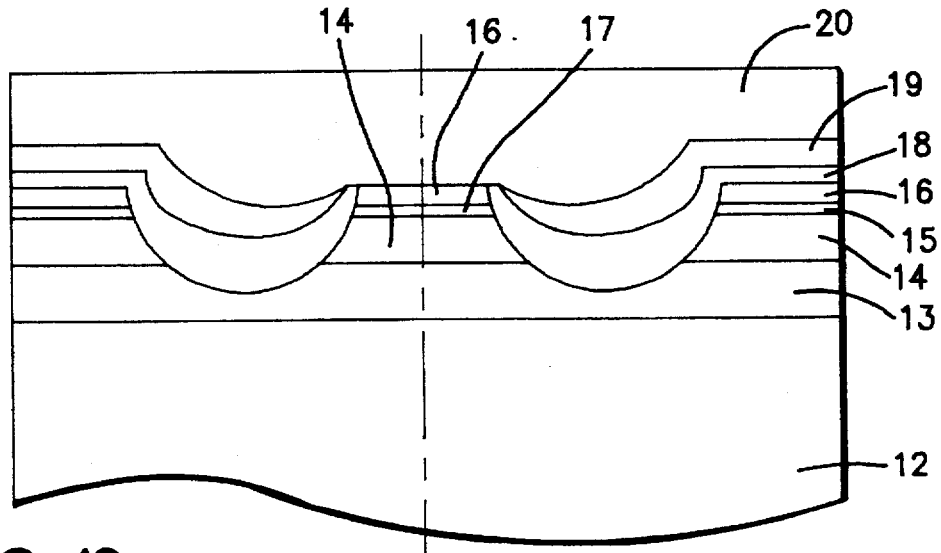
FIG. 13 is a cross sectional view showing a conventional semiconductor laser having a DC-PBH structure.

Next, the method for the manufacture of this embodiment is described referring to FIG. 8(a) and FIG. 8(b), which are schematic diagrams illustrating the manufacturing process steps of this embodiment. As FIG. 8(a) shows, a p-InP buffer layer 78 (~5×10$^{17}$ cm$^{-3}$ Zn doped) of a thickness of 0.5 μm is grown on a p-InP(001) substrate 77 by the MOVPE method. Using conventional film depositing techniques and lithographic techniques, a silicon oxide film 89 is formed except for a striped portion which is to be the mesa-striped active layer region, and a p-InP cladding layer 84 (~5×10$^{17}$ cm$^{-3}$ Zn doped) is selectively grown using the silicon oxide film 89 as the mask by the MOVPE method. Further, an InGaAsP active layer 85 of a band gap wavelength of 1.3 μm is grown, and an n-InP cladding layer 86 (~1.2×10$^{18}$ cm$^{-3}$ Si doped) of a thickness of 0.6 μm is grown, to form a DH wafer.

Although the MOVPE method is used in this embodiment, the use of the MBE method is also possible. If the active layer is made up of a MQW active layer comprising a SCH-type MQW structure as described previously, further improvement in lasing properties are expected.

Next, as shown in FIG. 8(b), after removing the silicon oxide film 89, both sides of the active layer other than the mesa-striped region are buried by sequentially growing a p-InP current blocking layer 79 (~1×10$^{18}$ cm$^{-3}$ Zn doped), an i-InGaAsP layer 80, an n-InP current blocking layer 81 (~1×10$^{18}$ cm$^{-3}$ Si doped), and a p-InP current blocking layer 82 (~1×10$^{18}$ cm$^{-3}$ Zn doped). As shown in FIG. 8(b), the thickness of the i-InGaAsP layer 80 decreases as they approach the mesa region. Although the MOVPE method is used to grow the burying layers in this embodiment, the use of the LPE method or the MBE method is also possible. By further growing an n-InP burying layer 83 (~1.2×10$^{18}$ cm$^{-3}$ Si doped), the buried heterostructure semiconductor laser on a p-type substrate as shown in FIG. 7 is obtained.

Figure 9A:
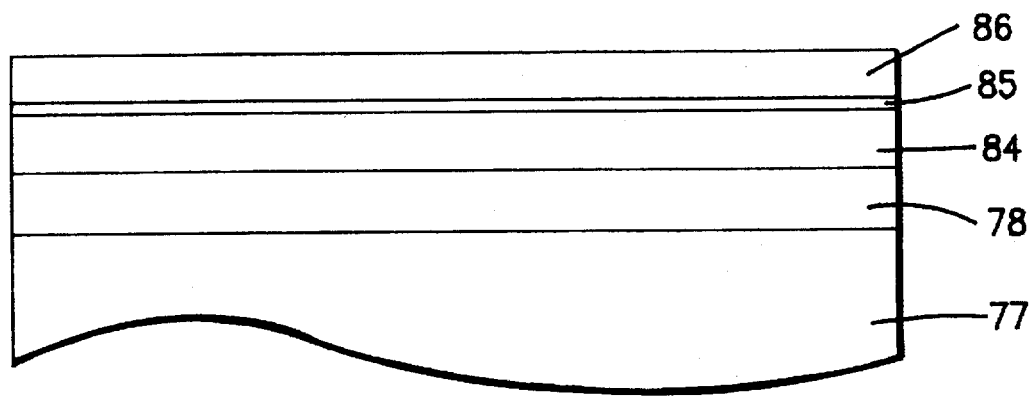
FIG. 9(a) is a diagram showing a wafer before burying.
Figure 9B:
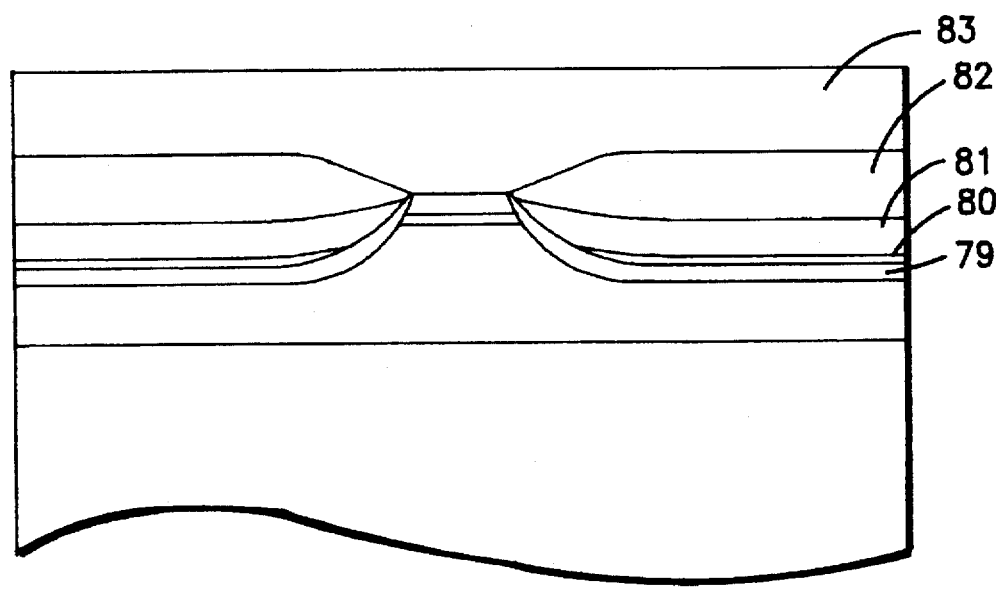
FIG. 9(b) is a diagram showing the buried form.

Next, another method for the manufacture is described referring to FIG. 9(a) and FIG. 9(b), which are schematic diagrams illustrating another manufacturing process steps of this embodiment. As FIG. 9(a) shows, after a p-InP buffer layer 78 (~5×10$^{17}$ cm$^{-3}$ Zn doped) of a thickness of 0.5 μm is grown on a p-InP(001) substrate 77, a p-InP cladding layer 84 (~5×10$^{17}$ cm$^{-3}$ Zn doped) is grown by the MOVPE method. Further, an InGaAsP active layer 85 of a band gap wavelength of 1.3 μm is grown, and an n-InP cladding layer 86 (~1.2×10$^{18}$ cm$^{-3}$ Si doped) of a thickness of 0.6 μm is grown, to form a DH wafer. Although the MOVPE method is used in this embodiment, the use of the MBE method is also possible. If the active layer is of an MQW structure, further improved properties are expected.

Next, as FIG. 9(b) shows, a mesa-striped active layer region is formed on the MQW wafer using a Br-methanol based etchant and a striped mask, as explained with reference to FIG. 3(b). Although wet etching is used in this embodiment, the use of dry etching is also possible. The sides of the mesa-striped active layer region is buried by sequentially growing a p-InP current blocking layer 79 (~1×10$^{18}$ cm$^{-3}$ Zn doped), an i-InGaAsP layer 80, an n-InP current blocking layer 81 (||1×10$^{18}$ cm$^{-3}$ Si doped), and a p-InP current blocking layer 82 (~1×10$^{18}$ cm$^{-3}$ Zn doped). As shown in FIG. 9(b), the thickness of the i-InGaAsP layer 80 decreases as they approach the mesa region. Although the MOVPE method is used to form the burying layers in this embodiment, the use of the LPE method or the MBE method is also possible. By further growing an n-InP burying layer 83 (~1.2×10$^{18}$ cm$^{-3}$ Si doped), the buried heterostructure semiconductor laser on a p-type substrate as shown in FIG. 8 is obtained.

Embodiment 6

Figure 10:
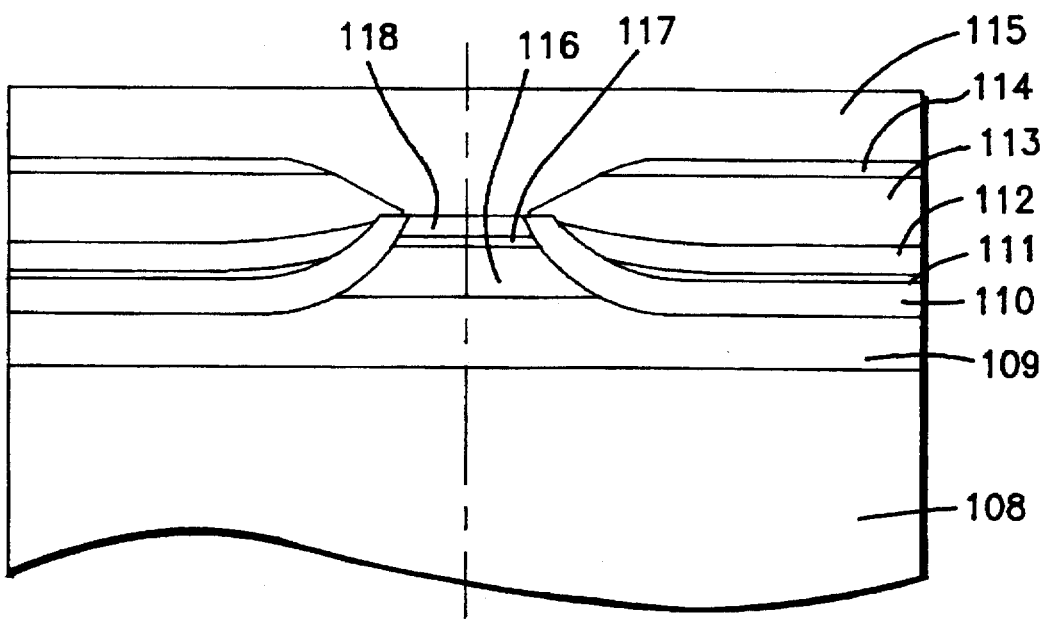
FIG. 10 is a diagram showing an InGaAsP/InP-based buried heterostructure semiconductor laser according to the alternative form of the third aspect of the present invention.

FIG. 10 is a diagram showing the structure of a semiconductor laser formed on a p-type InP substrate according to the third aspect of the present invention but with the alternative mesa periphery configuration, i.e., without the double-channel configuration. InP is used as the first p-type semiconductor layer, the second p-type semiconductor layer, the first n-type semiconductor layer, the third p-type semiconductor layer, and the second n-type semiconductor layer, and InGaAsP is used as the second and third semiconductor layer as well as the active layer.

This semiconductor laser is formed on a p-InP(001) substrate 108, and has a mesa-striped active layer region having a height which extends from the p-InP buffer layer 109 at the foot of the mesa to the n-InP cladding layer 118 at the top of the mesa. The two sides of the mesa are sequentially buried with a p-InP current blocking layer 110, an i-InGaAsP layer 111, an n-InP current blocking layer 112, a p-InP current blocking layer 113, and a p-InP current blocking layer an i-InGaAsP 114, and further the entire structure is buried with an n-InP burying layer 115. As shown in FIG. 10, due to the same leakage path considerations stated earlier for the first embodiment of this invention, it is preferable that the p-InP current blocking layer 110 and the n-InP current blocking layer 112, as well as the p-InP current blocking layer 113 and the n-InP burying layer 115 are in contact with each other at portions adjacent to the mesa structure.

In FIG. 10, 116 indicates the p-InP cladding layer, 117 indicates the InGaAsP active layer, and 118 indicates the n-InP cladding layer.

The method for manufacturing this semiconductor laser is the same as the method of Embodiment 5.

Embodiment 7

Figure 11:
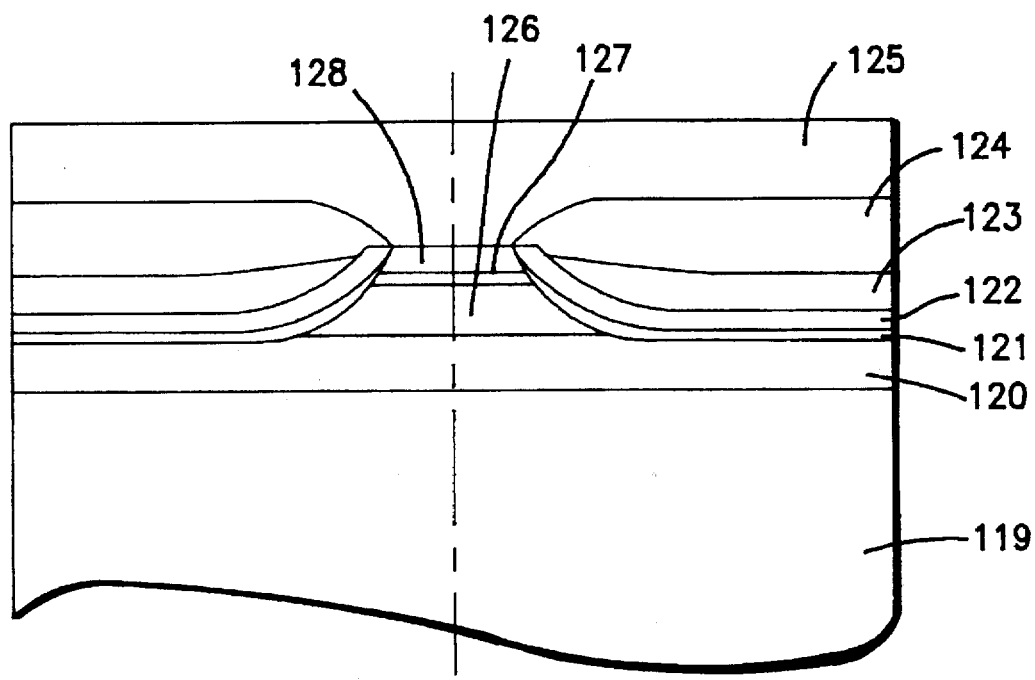
FIG. 11 is a diagram showing an InGaAsP/InP-based buried heterostructure semiconductor laser according to the alternative form of the fourth aspect of the present invention.
Figure 12:
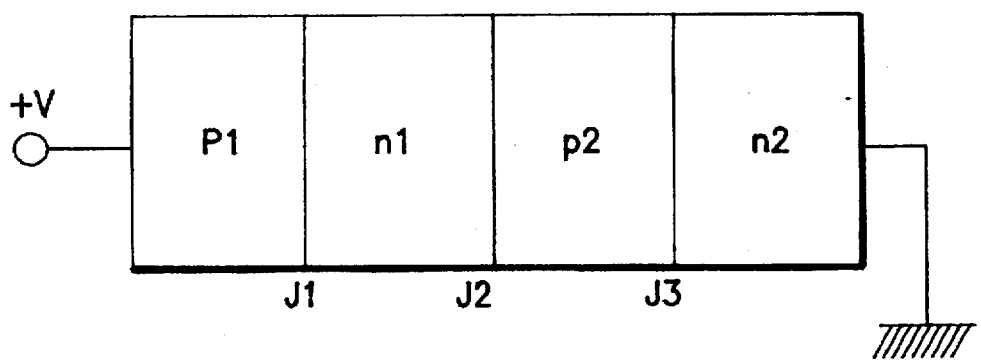
FIG. 12 is a diagram showing a thyristor structure for illustrating the present invention.

FIG. 11 is a diagram showing the structure of a semiconductor laser formed on a p-type InP substrate according to the fourth aspect of the present invention, but with the alternative mesa periphery configuration, i.e., without the double-channel configuration. InP is used as the first p-type semiconductor layer, the second p-type semiconductor layer, the first n-type semiconductor layer, the third p-type semiconductor layer, and the second n-type semiconductor layer, and InGaAsP is used as the active layer. Additionally, p-type InP with a carrier concentration of about $1 \times 10^{17}$ cm$^{-3}$ is used as the fourth p-type semiconductor layer.

This semiconductor laser is formed on a p-InP(001) substrate 119, and has a mesa-striped active layer region having a height which extends from the p-InP buffer layer 120 at the foot of the mesa to the n-InP cladding layer 128 at the top of the mesa. The two sides of the mesa are sequentially buried with a p-InP current blocking layer 121, a low-carrier-density p-InP current blocking layer 122, an n-InP current blocking layer 123, and a p-InP current blocking layer 124, and further the entire structure is buried with an n-InP burying layer 125.

In FIG. 11, 126 indicates the p-InP cladding layer, 127 indicates the InGaAsP active layer, and 128 indicates the n-InP cladding layer.

The method for manufacturing this semiconductor laser is the same as the method of Embodiment 5.

Although preferred embodiments of the present invention were described above, the present invention is not only applicable to the InGaAsP/InP buried heterostructure lasers, but also to AlGaAs/GaAs, AlInGaAs/InP, AlGaInP/GaAs, and many other compound semiconductor material based buried heterostructure lasers including group II–VI compound semiconductors as well. Needless to say, the application of these BH lasers will not be limited to optical interconnection and optical communication.

As described above, the buried heterostructure p-type substrate semiconductor laser according to the present invention eliminates the drawbacks of DC-PBH lasers of the conventional structure, and provides a semiconductor laser having excellent high temperature properties using a p-type substrate.

I claim:

1. A buried heterostructure semiconductor laser formed on a semiconductor substrate having a p-type conductivity comprising:

an active layer region having a striped-mesa shape elongated in a lasing cavity direction;

a pair of channels having a depth reaching a first p-type semiconductor layer and formed on both sides of said active layer region;

a second p-type semiconductor layer, a first semiconductor layer, a first n-type semiconductor layer, a third p-type semiconductor layer, and a second semiconductor layer sequentially laminated within said pair of channels to bury said pair of channels;

said first semiconductor layer and said second semiconductor layer each having a band gap smaller than the band gap of any of said second p-type semiconductor layer, said first n-type semiconductor layer, and said third p-type semiconductor layer; and a second n-type semiconductor layer covering the surfaces of said active layer region said second semiconductor layer.

2. A buried heterostructure semiconductor laser formed on a semiconductor laser formed on a semiconductor substrate having a p-type conductivity comprising:

a striped-mesa shaped region elongated in a lasing cavity direction and including an active layer region;

a first p-type semiconductor layer, a first semiconductor layer, a first n-type semiconductor layer, a second p-type semiconductor layer and a second semiconductor layer sequentially laminated on both sides of said striped-mesa shaped region;

said first semiconductor layer and said second semiconductor layer both having a band gap smaller than the band gap of any of said first p-type semiconductor layer, said first n-type semiconductor layer, and said second p-type semiconductor layer; and a second n-type semiconductor layer covering the surfaces of said active layer region and said second semiconductor layer.

3. The buried heterostructure semiconductor laser as claimed in claim 1, wherein said active layer region having a striped-mesa shape comprises a sequential lamination of a p-type cladding layer, an active layer, and a n-type cladding layer, said active layer having a band gap smaller than said p-type cladding layer, said n-type cladding layer, said first p-type semiconductor layer, said second p-type semiconductor layer, said first n-type semiconductor layer, said third p-type semiconductor layer, said second semiconductor layer, and said second n-type semiconductor layer.

4. The buried heterostructure semiconductor laser as claimed in claim 1, wherein said active layer, said first semiconductor layer and said second semiconductor layer are of InGaAsP material, and said p-type cladding layer, said n-type cladding layer, said first p-type semiconductor layer, said second p-type semiconductor layer, said first n-type semiconductor layer, said third p-type semiconductor layer, and said second n-type semiconductor layer are of InP material.

5. The buried heterostructure semiconductor laser as claimed in claim 2, wherein said active layer region having a striped-mesa shape comprises a sequential lamination of a p-type cladding layer, an active layer, and a n-type cladding layer, said active layer having a band gap smaller than said p-type cladding layer, said n-type cladding layer, said first p-type semiconductor layer, said second p-type semiconductor layer, said first n-type semiconductor layer, and said second n-type semiconductor layer.

6. The buried heterostructure laser as claimed in claim 2, wherein said active layer and said second semiconductor layer are of InGaAsP material, and said p-type cladding layer, a said n-type cladding layer, said first p-type semiconductor layer, said second p-type semiconductor layer, said first n-type semiconductor layer, and said second n-type semiconductor layer are of InP material.

7. The buried heterostructure semiconductor laser as claimed in claim 3, wherein said active layer, said first semiconductor layer and said second semiconductor layer are of InGaAsP material, and said p-type cladding layer, said n-type cladding layer, said first p-type semiconductor layer, said second p-type semiconductor layer, said first n-type semiconductor layer, said third p-type semiconductor layer, and said second n-type semiconductor layer are of InP material.

8. The buried heterostructure semiconductor laser as claimed in claim 1, wherein said active layer region comprises a sequential lamination of a p-type cladding layer, an active layer having a band gap smaller than said p-type cladding layer and an n-type cladding layer having a band gap larger than said active layer, said active layer further comprising at least one quantum well layer interposed between barrier layers having band gaps larger than said quantum well layer.

9. The buried heterostructure semiconductor laser as claimed in claim 2, wherein said active layer region comprises a sequential lamination of a p-type cladding layer, an active layer having a band gap smaller than said p-type cladding layer and an n-type cladding layer having a band gap larger than said active layer, said active layer further comprising at least one quantum well layer interposed between barrier layers having band gaps larger than said quantum well layer.

10. A buried heterostructure semiconductor laser formed on a semiconductor substrate having a p-type conductivity comprising:

an active layer region having a striped-mesa shape elongated in a lasing cavity direction;

a pair of channels having a depth reaching a first p-type semiconductor layer and formed on both sides of said active layer region;

a second p-type semiconductor layer, a first semiconductor layer, a first n-type semiconductor layer, a third p-type semiconductor layer, and a second semiconductor layer sequentially laminated within said pair of channels to bury said pair of channels;

said first semiconductor layer and said second semiconductor layer each having a band gap smaller than the band gap of any of said second p-type semiconductor layer, said first n-type semiconductor layer, and said third p-type semiconductor layer; and a second n-type semiconductor layer covering the surfaces of said active layer region said second semiconductor layer, wherein said second p-type semiconductor layer is in direction contact with said first n-type semiconductor layer at portions adjacent to said active layer region, and said third p-type semiconductor layer is in direct contact with said second n-type semiconductor layer at portions adjacent to said active layer region.

11. A buried heterostructure semiconductor laser formed on a semiconductor substrate having a p-type conductivity comprising:

a striped-mesa shaped region elongated in a lasing cavity direction and including an active layer region;

a first p-type semiconductor layer, a first semiconductor layer, a first n-type semiconductor layer, a second p-type semiconductor layer and a second semiconductor layer sequentially laminated on both sides of said striped-mesa shaped region;

said first semiconductor layer and said second semiconductor layer both having a band gap smaller than the band gap of any of said first p-type semiconductor layer, said first n-type semiconductor layer, and said second p-type semiconductor layer; and a second n-type semiconductor layer covering the surfaces of said active layer region and said second semiconductor layer, wherein said first p-type semiconductor layer is in direct contact with said first n-type semiconductor layer at portions adjacent to said active layer region, and said second p-type semiconductor layer is in direct contact with said second n-type semiconductor layer at portions adjacent to said active layer region.

12. The buried heterostructure semiconductor laser as claimed in claim 1, wherein said first semiconductor layer is an insulative layer.

13. The buried heterostructure semiconductor laser as claimed in claim 2, wherein said first semiconductor layer is an insulative layer.

14. The buried heterostructure semiconductor laser as claimed in claim 1, wherein said first semiconductor layer is undoped InGaAsP.

15. The buried heterostructure semiconductor laser as claimed in claim 2, wherein said first semiconductor layer is undoped InGaAsP.

* * * * *